United States Patent
Hsu

(10) Patent No.: US 7,989,827 B2
(45) Date of Patent: Aug. 2, 2011

(54) MULTICHIP LIGHT EMITTING DIODE PACKAGE

(75) Inventor: Chih-Peng Hsu, Jhongli (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 623 days.

(21) Appl. No.: 11/132,485

(22) Filed: May 19, 2005

(65) Prior Publication Data

US 2006/0261365 A1 Nov. 23, 2006

(51) Int. Cl.
  *H01L 33/00* (2010.01)
(52) U.S. Cl. ...... 257/98; 257/99; 257/100; 257/E29.329
(58) Field of Classification Search ............ 257/98–100, 257/E29.329
See application file for complete search history.

(56) References Cited

U.S. PATENT DOCUMENTS

| | | | |
|---|---|---|---|
| 6,365,920 B1* | 4/2002 | Abramov et al. ............... | 257/81 |
| 7,046,926 B2* | 5/2006 | Chikugawa ................... | 396/175 |
| 2002/0006040 A1* | 1/2002 | Kamada et al. ............... | 362/237 |
| 2004/0046179 A1* | 3/2004 | Baur et al. ...................... | 257/98 |
| 2005/0087680 A1* | 4/2005 | Lu ............................. | 250/231.13 |

* cited by examiner

Primary Examiner — Samuel A Gebremariam
(74) Attorney, Agent, or Firm — Raymond J. Chew

(57) ABSTRACT

A multichip light emitting diode package is provided. The multichip light emitting diode (LED) package includes a substrate having a non-plane surface including a plurality of sectioned-surfaces, a plurality of light emitting diode chips and a transparent molding material. Each of the light emitting diode chips is disposed on one of the sectioned-surfaces of the substrate. The transparent molding material is formed on the substrate for encapsulating the light emitting diode chips. By way of the configurations of the non-plane surface of the substrate and the transparent molding material, the multichip light emitting diode package emits converging light in accordance with the Snell's law. The purposes of evenly mixing emitting lights and improving brightness are achieved. The present invention can provide a single color, multi-color or full-color multichip LED package with uniform brightness and hues.

10 Claims, 7 Drawing Sheets

MULTICHIP LIGHT EMITTING DIODE PACKAGE

BACKGROUND OF THE INVENTION

1. Field of the Invention

The present invention relates to a multichip light emitting diode (LED) package, and more particularly to a multichip light emitting diode package with a substrate having a non-plane surface including a plurality of sectioned-surfaces for disposing LEDs.

2. Description of the Prior Art

As a good light source and device made by semiconductor material, LEDs possess advantages of small size, long lifetime, low driving voltage, rapid response, and good oscillation-proof, etc.

By changing the semiconductor materials and device structures, LEDs with different visible and invisible colors can be designed, wherein AlGaAs, InGaAlP and InGaN are suitable for producing LEDs with high luminance over 1000 mcd.

When producing red or infrared LEDs with high luminance by AlGaAs, an LPE process and DE structure devices are used for industrial mass production.

InGaAlP can be used to produce red, orange, yellow and yellow-green LEDs, and an MOVPE (Metal Organic Vapor Physical Epitaxy) process, double hetero (DH) junction structures, and quantum well (QW) structures are provided in efficient mass production. FIG. 1 shows a schematic cross-sectioned view of a traditional InGaAlP/GaAs or InGaAlP/GaP yellow LED chip 10. An InGaAlP epitaxial layer 14 is formed on an N-type GaAs substrate 13. A positive bond pad 11 is formed by gold (Au) for being connected to an anode package leg, and a negative bond pad 12 is formed by Al or Au and connected to a cathode package leg.

InGaN is suitable for producing green, blue and ultraviolet LEDs with high luminance by high temperature MOVPE processes, wherein DH structures and QW structures are used, too. FIG. 2 shows a schematic cross-sectioned view of a traditional blue LED chip 20. A substrate 23 is formed by transparent sapphire. An upper P-type InGaN epitaxial layer 25 and a lower N-type InGaN epitaxial layer 24 are deposited on the substrate 23. A positive bond pad 21 is formed on the P-type InGaN epitaxial layer 25 for being connected to an anode package leg, and a negative bond pad 22 is formed on the N-type InGaN epitaxial layer 24 for being connected to a cathode package leg. Alternatively, the N-type InGaN epitaxial layer 24 can be epitaxied on the P-type InGaN epitaxial layer 25. As shown in FIG. 2, the sapphire substrate 23 as a support base results in a different connecting type for the negative bond pad 22 from FIG. 2.

Color light other than red, green and blue light can be obtained by adjusting the intensities of the primary colors of red, green and blue lights. If there are red, blue, and green primary colors, by adjusting the intensity of each color, a full color light source can be obtained. FIG. 3 shows a schematic cross-sectioned view of a conventional full color LED chip, a red, a green and a blue primary color LEDs are packaged with chips 301, 302 and 303 in a row or in array by die bond on a printed circuit board 305. The power of the red LED is applied to the positive pad 306 and via the ground pad 304 on the printed circuit board 305 to the negative of the source, the same method is applied to the green and blue LEDs. Generally, a constant current source 20 mA is used as the power source. For example, 20 mA with voltage of 2V is applied to the red LED 301; 20 mA with voltage of 3.5 V is applied to the green LED 302 and 20 mA with voltage of 3.5 V is applied to the blue LED 303, a white light is obtained and the power consumption is 180 mW (20×2+20×3.5+20×3.5=180 mW); if full color is needed, the current is still kept at 20 mA, but by control the lighting period of each LED to combined the light, different color lights can be obtained if desired.

For increasing light brightness, a multichip light emitting diode package encapsulating multiple LED chips is developed. And, as the rapid development of mobile phones and PDAs (Personal Digital Assistants), there is a request to develop colorful LED panels to display colorful images. Therefore, it is necessary to develop a multichip LED package with three light emitting diodes (generally red, blue and green).

FIG. 4 is a schematic cross-sectioned view of a conventional multichip light emitting diode package, two LED chips 41 and 42 are disposed on a flat surface of a printed circuit board 40, and a dome-shaped epoxy resin 43 is coated on the printed circuit board 40 for encapsulating the two LED chips 41 and 42. The light emitting from the two LED chips 41 and 42 travels through the epoxy resin 43 and enters the air. Since the light of the two LED chips 41 and 42 travels through two media with different indices of refraction, the light emitting from the two LED chips 41 and 42 is deflected at the boundary between the epoxy resin 43 and the air according to the snell's law of $n_1 \sin \theta_1 = n_2 \sin \theta_2$. As a result, beam divergence happens, as shown in FIG. 4. Therefore, when the two LED chips 41 and 42 emit same color light, the multichip light emitting diode package would emit light with non-uniform brightness. When the two LED chips 41 and 42 emit different color light, the multichip light emitting diode package would emit light with non-uniform hues.

FIG. 5 is a schematic cross-sectioned view of a conventional white light multichip light emitting diode package, a red LED chip 51, a green LED chip 52 and a blue LED chip 53 are disposed on a flat surface of a printed circuit board 50. A molding epoxy resin 54 is coated on the printed circuit board 50 to encapsulate the three LED chips 51, 52 and 53. The light emitting from each of the red LED chip 51, green LED chip 52 and blue LED chip 53 travels through two media with different indices of refraction. The light of the red LED chip 51, green LED chip 52 and blue LED chip 53 is deflected at boundary between the epoxy resin 54 and the air according to the snell's law. Beam divergence happens. As a result, the red, green and blue lights of the three LED chips 51, 52 and 53 cannot be uniformly mixed after traveling out the epoxy resin 54. The white light multichip light emitting diode package cannot provide uniform white light.

The conventional multichip light emitting diode package structure as above cannot provide illuminating light with uniform brightness and hues. The illumination quality of them is adversely influenced. Therefore, an improved multichip light emitting diode package structure is developed, which is as shown in FIG. 6. Two LED chips 61 and 62 are disposed on a flat surface of a printed circuit board 60. A double dome-shaped epoxy mold 63 is coated on the printed circuit board 60 for encapsulating the two LED chips 61 and 62, each of the double dome-shaped epoxy mold 63 is formed above one of the two LED chips 61 and 62. However, it is difficult to form the double dome-shaped epoxy mold 63 by mold injection. And, it is not easy to control the illumination of the two LED chips 61 and 62 to attain consistence.

Accordingly, it is an intention to provide an improved multichip light emitting diode package structure, which can overcome the above drawbacks.

SUMMARY OF THE INVENTION

It is one objective of the present invention to provide a multichip light emitting diode package, which provides a substrate having a non-plane surface including a plurality of sectioned-surfaces for disposing LEDs such that the multichip LED package can emit single color, multi-color or full color light with uniform brightness and hues.

It is another objective of the present invention to provide a multichip light emitting diode package, which can be fabricated to a single color light LED package or a multi-color or a full color light LED package with improved brightness and hues.

It is a further objective of the present invention to provide a multichip light emitting diode package, in which a heat sink is disposed under the substrate of the LED package to improve heat dissipation.

It is still a further objective of the present invention to provide a multichip light emitting diode package, which electrically couples with an electro-static protective device to prevent the LEDs from damage by the static discharge.

In order to achieve the above objectives of this invention, the present invention provides a multichip light emitting diode package including a substrate having a non-plane surface including a plurality of sectioned surfaces, a plurality of light emitting diode chips and a transparent molding material. Each of the light emitting diode chips is disposed on one of the sectioned-surfaces of the substrate. The transparent molding material is formed on the substrate for encapsulating the light emitting diodes. The direction of the light axis of each of the light emitting diode chips is controlled by an angle contained between two adjacent sectioned-surfaces of the substrate. The properties of the far-field light divergence and far-field light distribution of the multichip light emitting diode package are controlled by the geometry of the transparent molding material. As a consequence, by way of the configurations of the non-plane surface of the substrate and the transparent molding material, the multichip light emitting diode package emits converging light in accordance with the Snell's law. Therefore, the present invention can provide a single color light LED package with improved brightness, or a multi-color or a full-color multichip LED package with uniform brightness and hues.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENTS

The present invention provides a multichip light emitting diode package including a substrate having a non-plane surface, a plurality of light emitting diode chips and a transparent molding material encapsulating the light emitting diode chips. The non-plane surface of the substrate includes a plurality of sectioned-surfaces, and each of the light emitting diode chips is disposed on one of the sectioned-surfaces of the substrate. The direction of the light axis of each of the light emitting diode chips is controlled by an angle contained between two adjacent sectioned-surfaces of the substrate. The properties of the far-field light divergence and far-field light distribution of the multichip light emitting diode package are controlled by the geometry of the transparent molding material. As a consequence, by way of the configurations of the non-plane surface of the substrate and the transparent molding material, the multichip light emitting diode package emits converging light in accordance with the Snell's law. The phenomenon of beam divergence is eliminated. The purposes of evenly mixing light and improving brightness are achieved. As a consequence, the present invention can provide a single light multichip LED package with uniform and improving brightness, and also can provide a multi-color or a full-color multichip LED package with uniform brightness and hues.

The LED chips used in the multichip LED package of the present invention may include any group of useful LED colors and any useful number of LED chips, which enable the multichip LED package to be operated to produce white or other colors of light. For purposes of illustration and not limited, the LED chips used in the multichip LED packages especially intended for producing white light may comprise conventional green, red and blue LED chips that respectively emit green, red and blue light. Any number of LED chips may be used to optimize the quality of the white light or other color light generated by the package. For example, the LED chips may include one red LED chip, two green LED chips and one blue LED chip.

The present invention will be described in detail in accordance with following preferred embodiments with reference to accompanying drawings.

Figure 1:
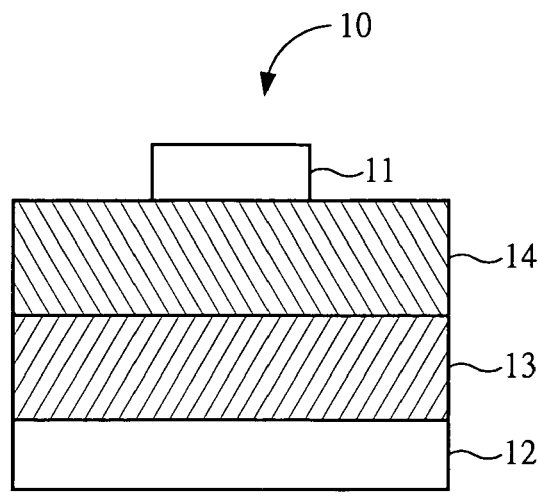
FIG. 1 is a schematic cross-sectioned view of a traditional InGaAlP/GaAs or InGaAlP/GaP yellow LED chip.
Figure 2:
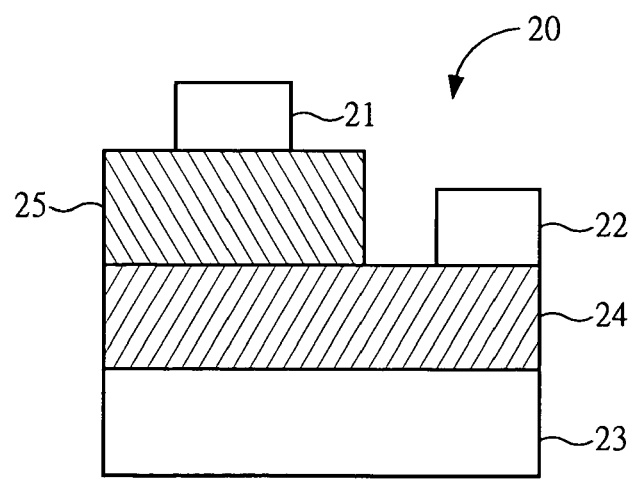
FIG. 2 is a schematic cross-sectioned view of a traditional blue LED chip.
Figure 3:
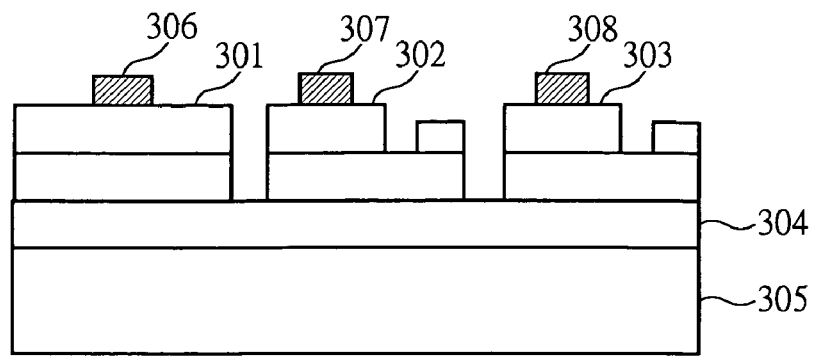
FIG. 3 is a schematic cross-sectioned view of a conventional full color LED chip.
Figure 4:
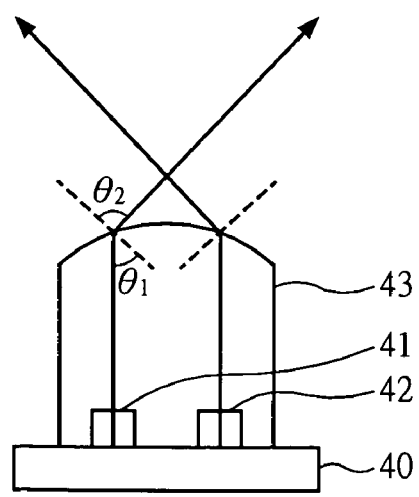
FIG. 4 is a schematic cross-sectioned view of a conventional multichip light emitting diode package.
Figure 5:
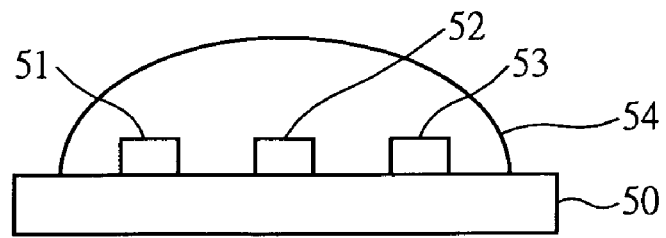
FIG. 5 is a schematic cross-sectioned view of a conventional white light multichip light emitting diode package.
Figure 6:
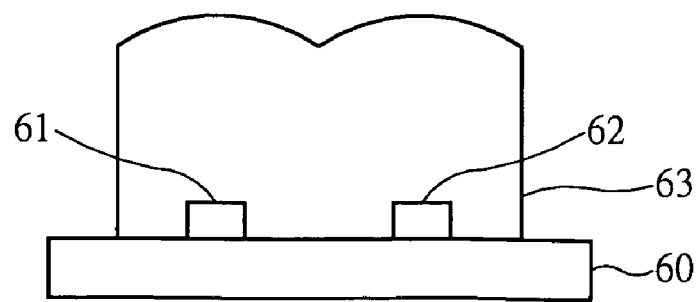
FIG. 6 is a schematic cross-sectioned view of another conventional multichip light emitting diode package.
Figure 7:
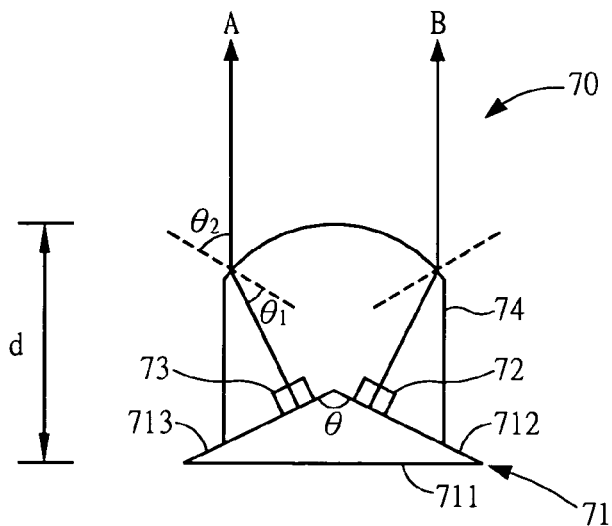
FIG. 7 is a schematic cross-sectioned view of a multichip light emitting diode package according to a first embodiment of the present invention.

FIG. 7 is a schematic cross-sectioned view of a multichip light emitting diode package 70 according to a first embodiment of the present invention. The multichip light emitting diode package 70 includes a wiring circuit board 71, two LED chips 72 and 73 and a dome-shaped transparent molding material 74. The wiring circuit board 71 includes an upper surface formed of two opposite inclined sides 712 and 713 and a base 711. The traverse cross section of the upper surface has an inversed V-shaped configuration. The wiring circuit board 71 can be a printed circuit board. Each of the LED chips 72 and 73 is respectively disposed on one of the two opposite inclined sides 712 and 713. The LED chips 72 and 73 can be same color LED chips or different color LED chips. The dome-shaped transparent molding material 74 is formed on the wiring circuit board 71 for encapsulating the two LED chips 72 and 73. The transparent molding material 74 can be a transparent resin material, for example a transparent epoxy material.

The distanced between the top of the dome-shaped transparent molding material 74 and the base 711 of the wiring circuit board 71, the degree θ contained between the two opposite inclined sides 712 and 713 and the curvature of the top surface of the dome-shaped transparent molding material 74 are optimized in order that the light emitting from each of the two LED chips 72 and 73 is convergent after traveling through the dome-shaped transparent molding material 74 according to the Snell's law. More specifically, in the first embodiment, the direction of the light axis of each of the light emitting diode chips is controlled by an angle contained between the two inclined sides 712 and 713, as dotted lines shown in FIG. 7. The properties of the far-field light divergence and far-field light distribution of each of the emitting diode chips 72 and 73 are controlled by the geometry of the transparent molding material 74. Therefore, the illuminating directions of the two LED chips 72 and 73 are shown as arrows A and B. As a result, the phenomenon of beam divergence is eliminated. Moreover, the size of each of the multichip light emitting diode package is within nanometer (mm), and the far-field distance of the light of the multichip light emitting diode package 70 is within centimeter (cm). Therefore, from a view of far-field distance, the multichip light emitting diode package 70 is like a point source. And, the far-field lights of the two LED chips 72 and 73 can be evenly mixed. As a consequence, the multichip light emitting diode package 70 emits light with improved and uniform brightness and uniform hue. Moreover, the configurations of the dome-shaped transparent molding material 74 and the wiring circuit board 71 are designed according to the parameters d, θ and the curvature of the dome-shaped transparent molding material 74.

Figure 7A:
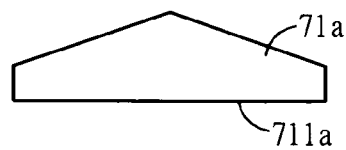
FIG. 7A is a schematic cross-sectioned view of a variance of the wiring circuit board of the multichip light emitting diode package of FIG. 7.
Figure 7B:
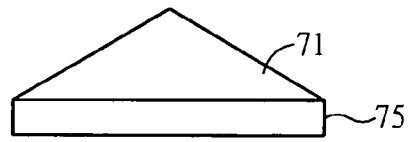
FIG. 7B is a schematic cross-sectioned view of a second variance of the wiring circuit board of the multichip light emitting diode package of FIG. 7.

Alternately, the traverse cross section of the wiring circuit board 71 can be designed to other configuration, for example, like a pentagonal body 71a with a base 711a, as shown in FIG. 7A. A heat sink 75, such as a copper heat sink, can be disposed under the wiring circuit board 71, as shown in FIG. 7B, to improve heat dissipation of the two LED chips 72 and 73.

Figure 7C:
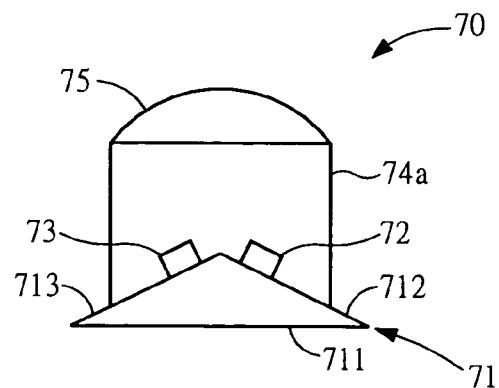
FIG. 7C is a schematic cross-sectioned view of another variance of the wiring circuit board of the multichip light emitting diode package of FIG. 7.

Moreover, as shown in FIG. 7C, the transparent molding material can be designed to a cylindrical transparent molding material 74a, and a lens 75 is disposed on the cylindrical transparent molding material 74a. The transparent molding material 74 can be instead of by the combination of the cylindrical transparent molding material 74a and the lens 75.

Figure 8:
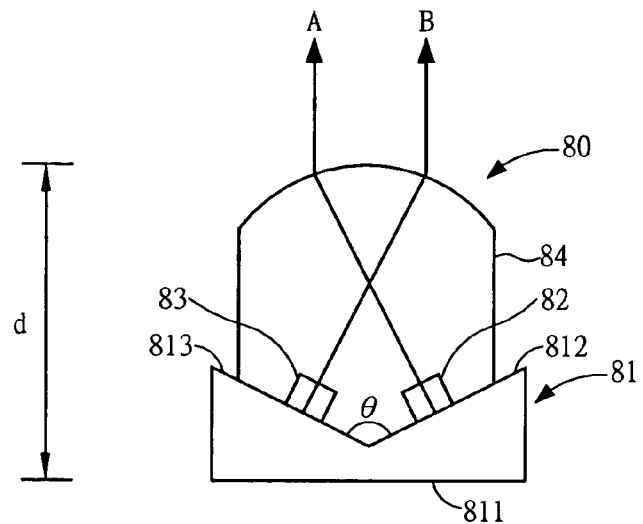
FIG. 8 is a schematic cross-sectioned view of a multichip light emitting diode package according to a second embodiment of the present invention.

FIG. 8 is a schematic cross-sectioned view of a multichip light emitting diode package 80 according to a second embodiment of the present invention. The multichip light emitting diode package 80 includes a wiring circuit board 81, two LED chips 82 and 83 and a dome-shaped transparent molding material 84. The wiring circuit board 81 includes an upper surface formed of two opposite inclined sides 812 and 813 and a base 811. The traverse cross section of the upper surface has a V-shaped configuration. The wiring circuit board 81 can be a printed circuit board. Each of the LED chips 82 and 83 is respectively disposed on one of the two opposite inclined sides 812 and 813. The LED chips 82 and 83 can be same color LED chips or different color LED chips. The dome-shaped transparent molding material 84 is formed on the wiring circuit board 81 for encapsulating the two LED chips 82 and 83. The transparent molding material 84 can be a transparent resin material, for example a transparent epoxy material.

The distance d between the top of the dome-shaped transparent molding material 84 and the base 811 of the wiring circuit board 81, the degree θ contained between the two opposite inclined sides 812 and 813 and the curvature of the top surface of the dome-shaped transparent molding material 84 are optimized in order that the light emitting from each of the two LED chips 82 and 83 is convergent after traveling through the dome-shaped transparent molding material 84 according to the Snell's law. As the first embodiment, the direction of the light axis of each of the light emitting diode chips is controlled by an angle contained between the two inclined sides 812 and 813. The properties of the far-field light divergence and far-field light distribution of each of the emitting diode chips 82 and 83 are controlled by the geometry of the transparent molding material 84. The illuminating directions of the two LED chips 82 and 83 are shown as arrows A and B. As a result, the phenomenon of beam divergence is eliminated. The far-field lights of the two LED chips 72 and 73 can be evenly mixed, and the multichip light emitting diode package 80 emits light with improved and uniform brightness and uniform hue. Moreover, the configurations of the dome-shaped transparent molding material 84 and the wiring circuit board 81 are designed according to the parameters d, θ and the curvature of the dome-shaped transparent molding material 84.

Moreover, the transparent molding material 84 can be designed to a cylindrical transparent molding material, and a lens is disposed on the cylindrical transparent molding material. The transparent molding material 84 can be instead of by the combination of the cylindrical transparent molding material and the lens.

Figure 8A:
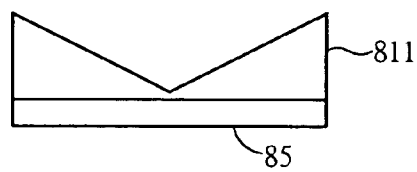
FIG. 8A is a schematic cross-sectioned view of a variance of the wiring circuit board of the multichip light emitting diode package of FIG. 8.

A heat sink 85, such as a copper heat sink, can be disposed under the wiring circuit board 811, as shown in FIG. 8A, to improve heat dissipation of the two LED chips 82 and 83.

Figure 9:
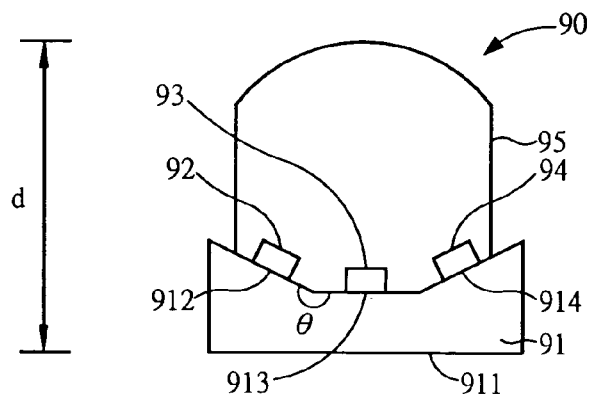
FIG. 9 is a schematic cross-sectioned view of a multichip light emitting diode package according to a third embodiment of the present invention.

FIG. 9 is a schematic cross-sectioned view of a multichip light emitting diode package 90 according to a third embodiment of the present invention. The multichip light emitting diode package 90 includes a wiring circuit board 91, three LED chips 92, 93 and 94 and a dome-shaped transparent molding material 95. The wiring circuit board 91 includes an upper surface formed of three sectioned-surfaces 912, 913 and 914 and a base 911. The traverse cross section of the upper surface has an inversed trapezoid configuration. The wiring circuit board 91 can be a printed circuit board. Each of the three LED chips 92, 93 and 94 is respectively disposed on one of the three sectioned-surfaces 912, 913 and 914. The three LED chips 92, 93 and 94 can be same color LED chips or different color LED chips, like red LED chip, green LED chip and blue LED chip. The dome-shaped transparent molding material 95 is formed on the wiring circuit board 91 for encapsulating the three LED chips 92, 93 and 94. The transparent molding material 95 can be a transparent resin material, for example a transparent epoxy material.

The distance d between the top of the dome-shaped transparent molding material 95 and the base 911 of the wiring circuit board 91, the degree θ contained between the two adjacent sectioned-surfaces 912 and 913 or 913 and 914 and the curvature of the top surface of the dome-shaped transparent molding material 95 are optimized in order that the light emitting from each of the three LED chips 92, 93 and 94 is convergent after traveling through the dome-shaped transparent molding material 95 according to the Snell's law. As the first embodiment, the direction of the light axis of each of the light emitting diode chips 92, 93 and 94 is controlled by an angle contained between the two adjacent sectioned-surfaces 912, 913 and 914. The properties of the far-field light divergence and far-field light distribution of each of the emitting diode chips 92, 93 and 94 are controlled by the geometry of the transparent molding material 95. By way of the combination of the configurations of the wiring circuit board 91 and the transparent molding material 95, the light of each of the light emitting diode chips 92, 93 and 94 is converged after traveling through the transparent molding material 95. As a result, the phenomenon of beam divergence is eliminated. The far-field lights of the three LED chips 92, 93 and 94 can be evenly mixed. The multichip light emitting diode package 90 emits light with improved and uniform brightness and uniform hue. Moreover, the configurations of the dome-shaped transparent molding material 95 and the wiring circuit board 91 are designed according to the parameters d, θ and the curvature of the dome-shaped transparent molding material 95.

Moreover, the transparent molding material 95 can be designed to a cylindrical transparent molding material, and a lens is disposed on the cylindrical transparent molding material. The transparent molding material 95 can be instead of by the combination of the cylindrical transparent molding material and the lens.

Figure 9A:
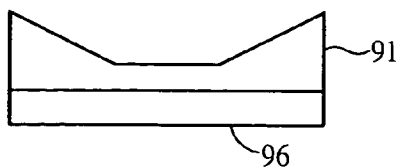
FIG. 9A is a schematic cross-sectioned view of a variance of the wiring circuit board of the multichip light emitting diode package of FIG. 9.

A heat sink 96, such as a copper heat sink, can be disposed under the wiring circuit board 91, as shown in FIG. 9A, to improve heat dissipation of the three LED chips 92, 93 and 94.

Figure 10:
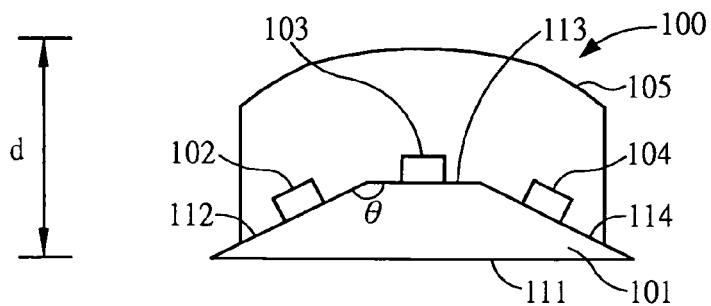
FIG. 10 is a schematic cross-sectioned view of a multichip light emitting diode package according to a fourth embodiment of the present invention.

FIG. 10 is a schematic cross-sectioned view of a multichip light emitting diode package 100 according to a fourth embodiment of the present invention. The multichip light emitting diode package 100 includes a wiring circuit board 101, three LED chips 102, 103 and 104 and a dome-shaped transparent molding material 105. The wiring circuit board 101 includes an upper surface formed of three sectioned-surfaces 112, 113 and 114 and a base 111. The traverse cross section of the upper surface has a trapezoid configuration. The wiring circuit board 101 can be a printed circuit board. Each of the three LED chips 102, 103 and 104 is respectively disposed on one of the three sectioned-surfaces 112, 113 and 114. The three LED chips 102, 103 and 104 can be same color LED chips or different color LED chips, like red LED chip, green LED chip and blue LED chip. Thus, the multichip light emitting diode package 100 can be a multi-color or a white light LED package as desired. The dome-shaped transparent molding material 105 is formed on the wiring circuit board 101 for encapsulating the three LED chips 102, 103 and 104. The transparent molding material 105 can be a transparent resin material, for example a transparent epoxy material.

The distance d between the top of the dome-shaped transparent molding material 105 and the base 111 of the wiring circuit board 101, the degree θ contained between the two adjacent sectioned-surfaces 112 and 113 or 113 and 114 and the curvature of the top surface of the dome-shaped transparent molding material 105 are optimized in order that the light emitting from each of the three LED chips 102, 103 and 104 is convergent after traveling through the dome-shaped transparent molding material 105 according to the Snell's law. As the first embodiment, the direction of the light axis of each of the light emitting diode chips 102, 103 and 104 is controlled by an angle contained between the two adjacent sectioned-surfaces 112, 113 and 114. The properties of the far-field light divergence and far-field light distribution of each of the emitting diode chips 102, 103 and 104 are controlled by the geometry of the transparent molding material 105. By way of the combination of the configurations of the wiring circuit board 101 and the transparent molding material 105, the light of each of the light emitting diode chips 102, 103 and 104 is converged after traveling through the transparent molding material 105. As a result, the phenomenon of beam divergence is eliminated. The far-field lights of the three LED chips 102, 103 and 104 can be evenly mixed. The multichip light emitting diode package 100 emits light with improved and uniform brightness and uniform hue. Moreover, the configurations of the dome-shaped transparent molding material 105 and the wiring circuit board 101 are designed according to the parameters d, θ and the curvature of the dome-shaped transparent molding material 105.

Moreover, the transparent molding material 100 can be designed to a cylindrical transparent molding material, and a lens is disposed on the cylindrical transparent molding material. The transparent molding material 100 can be instead of by the combination of the cylindrical transparent molding material and the lens.

Figure 10A:
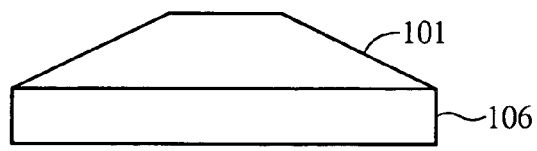
FIG. 10A is a schematic cross-sectioned view of a variance of the wiring circuit board of the multichip light emitting diode package of FIG. 9.

A heat sink 106, such as a copper heat sink, can be disposed under the wiring circuit board 101, as shown in FIG. 10A, to improve heat dissipation of the three LED chips 102, 103 and 104.

Figure 11A:
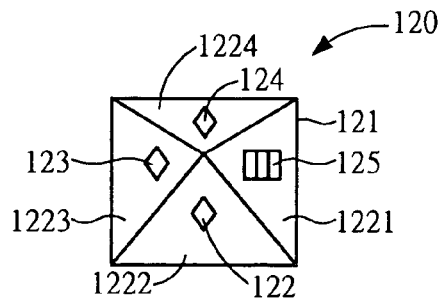
FIG. 11A is a schematic perspective view of a multichip light emitting diode package according to a fifth embodiment of the present invention.
Figure 11B:
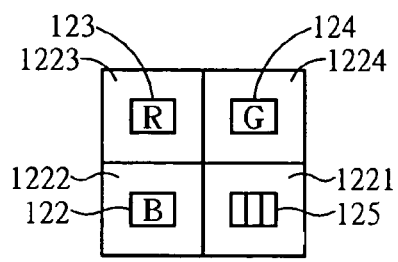
FIG. 11B is a schematic top view of the multichip light emitting diode package of FIG. 11A.

FIG. 11A is a schematic perspective view of a multichip light emitting diode package 120 according to a fifth embodiment of the present invention. FIG. 11B is a schematic top view of the multichip light emitting diode package 120. The multichip light emitting diode package 120 includes a wiring circuit board 121, three LED chips 122, 123 and 124, a diode array 125 and a dome-shaped transparent molding material (not shown). The wiring circuit board 121 has a pyramid configuration including a base (not shown) and four adjacent inclined sides 1221, 1222, 1223 and 1224. The wiring circuit board 121 can be a printed circuit board. The three LED chips 122, 123 and 124 are respectively disposed on the inclined sides 1222, 1223 and 1224. The three LED chips 122, 123 and 124 can be same color LED chips or different color LED chips, like red LED chip, green LED chip and blue LED chip. Thus, the multichip light emitting diode package 100 can be a single-color, multi-color, full-color or white light LED package. The diode array 125 is formed on the inclined side 1221 of the wiring circuit board 121. Each diode of the diode array 125 is respectively electrically parallelly connected to one of the three LED chips 122,123 and 124 to serve as an electro-static protective diode. The diode array 125 can be a zener diode array. The dome-shaped transparent molding material (not shown) is formed on the wiring circuit board 121 for encapsulating the three LED chips 122, 123 and 124, and the diode array 125. The transparent molding material can be a transparent resin material, for example a transparent epoxy material.

Moreover, the transparent molding material can be designed to a cylindrical transparent molding material, and a lens is disposed on the cylindrical transparent molding material. The transparent molding material can be instead of by the combination of the cylindrical transparent molding material and the lens.

The configurations of the dome-shaped transparent molding material and the pyramid-shaped wiring circuit board 121 are optimized in order that the light emitting from each of the three LED chips 122, 123 and 124 is convergent after traveling through the dome-shaped transparent molding material according to the Snell's law. As a result, the phenomenon of beam divergence is eliminated. The far-field light of each of the light emitting from the three LED chips 122, 123 and 124 can be evenly mixed. The multichip light emitting diode package 120 emits light with improved and uniform brightness and uniform hue.

Figure 12:
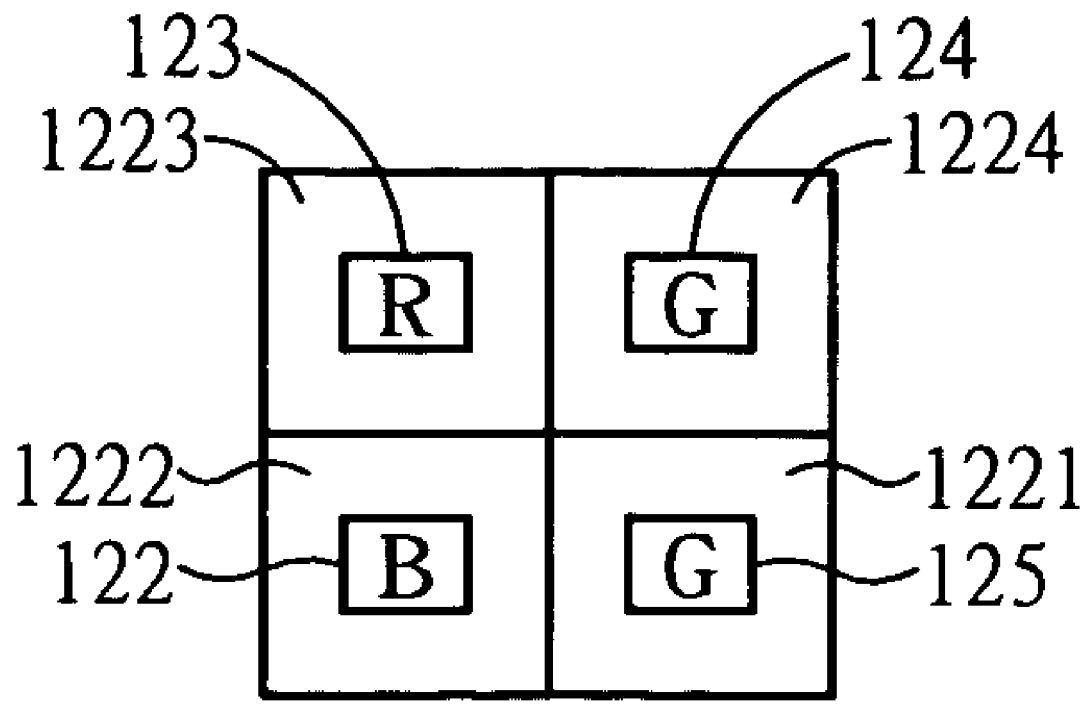
FIG. 12 is a schematic top view of a variance of the multichip light emitting diode package of FIG. 11A.

As shown in FIG. 12, the multichip light emitting diode package 120 also can include one blue LED chip 122, one red LED chip 123 and two green LED chips 124 and 125, respectively disposed on the four inclined sides 1222, 1223, 1224 and 1225 so as to optimize the quality of the white light generated by the multichip light emitting diode package 120. Moreover, the multichip light emitting diode package 120 can include the light emitting diode chips with various numbers and various colors. Thus, various color light sources can be obtained.

Moreover, the multichip light emitting diode package of the present invention can be applied to a leadframe package, and the leadframe can be designed to various configurations as the substrate of the above embodiments. The multichip light emitting diode package of the present invention also can be applied to a metal can style laser diode package, the substrate of the metal can be designed to various configurations as the substrate of the above embodiments for mounting the laser diodes.

The embodiments are only used to illustrate the present invention, not intended to limit the scope thereof. Many modifications of the embodiments can be made without departing from the spirit of the present invention.

What is claimed is:

1. A multichip light emitting diode package, comprising:
   a substrate having a non-planar surface including a plurality of sectioned-surfaces;
   a plurality of light emitting diode (LED) chips respectively disposed on one of said sectioned-surfaces of said substrate for emitting light beams; and
   a single dome-shaped transparent molding material configured on said substrate for encapsulating said plurality of LED chips, which includes a cylindrical transparent molding material and a lens disposed on said cylindrical transparent molding material, wherein said light beams emitted from said plural LED chips are parallel respectively and non-divergent after traveling through said single dome-shaped transparent molding material.

2. The multichip light emitting diode package of claim 1, further comprising a heat sink disposed under said substrate.

3. The multichip light emitting diode package of claim 1, wherein said substrate has a pyramid body and each of said plurality of LED chips is respectively disposed on one side of said pyramid body of said substrate.

4. The multichip light emitting diode package of claim 1, wherein a cross-section of said substrate is selected from a group consisting of an inversed V shape, a V shape, a trapezoid shape and an inversed trapezoid shape.

5. The multichip light emitting diode package of claim 4, further comprising a heat sink disposed under said substrate.

6. The multichip light emitting diode package of claim 1, wherein said substrate is selected from a group consisting of printed circuit board, leadframe and metal can.

7. The multichip light emitting diode package of claim 6, wherein the traverse cross-section of said non-planar surface of said substrate has a configuration selected from a group consisting of an inversed V shape, a V shape, a trapezoid shape and an inversed trapezoid shape.

8. The multichip light emitting diode package of claim 1, wherein the package further includes a diode array disposed on one side of said pyramid body and each diode of said diode array is respectively electrically connected in parallel to one of said LED chips to serve as an electro-static protective diode.

9. The multichip light emitting diode package of claim 8, wherein said diode array includes a zener diode array.

10. A multichip light emitting diode package, comprising:
    a substrate having a non-planar surface including a plurality of sectioned-surfaces,
    a plurality of light emitting diode chips respectively disposed on one of said sectioned-surfaces of said substrate for emitting light beams; and
    a single dome-shaped transparent molding material encapsulating said LED chips, which includes a cylindrical transparent molding material and a lens disposed on said cylindrical transparent molding material and is corresponding to said plurality of light emitting diode chips, wherein said light beams emitted from each LED chip are substantially collimated after traveling through said single dome shaped transparent molding material encapsulating said LED chips.

* * * * *